United States Patent
Seo et al.

(10) Patent No.: US 11,534,887 B2
(45) Date of Patent: Dec. 27, 2022

(54) POLISHING PAD AND METHOD FOR PREPARING SEMICONDUCTOR DEVICE USING SAME

(71) Applicant: SKC SOLMICS CO., LTD., Pyeongtaek-si (KR)

(72) Inventors: Jangwon Seo, Suwon-si (KR); Eun Sun Joeng, Suwon-si (KR); Jong Wook Yun, Suwon-si (KR)

(73) Assignee: SKC SOLMICS CO., LTD., Pyeongtaek-si (KR)

( * ) Notice: Subject to any disclaimer, the term of this patent is extended or adjusted under 35 U.S.C. 154(b) by 0 days.

(21) Appl. No.: 17/202,977

(22) Filed: Mar. 16, 2021

(65) Prior Publication Data
US 2021/0291315 A1 Sep. 23, 2021

(30) Foreign Application Priority Data

Mar. 17, 2020 (KR) .................. 10-2020-0032692
Mar. 17, 2020 (KR) .................. 10-2020-0032878

(51) Int. Cl.
 *B24B 37/22* (2012.01)
 *H01L 21/321* (2006.01)
 *H01L 21/3105* (2006.01)

(52) U.S. Cl.
 CPC ........ *B24B 37/22* (2013.01); *H01L 21/31053* (2013.01); *H01L 21/3212* (2013.01)

(58) Field of Classification Search
 CPC ....... B24B 37/20; B24B 37/205; B24B 37/22; B24B 37/24; B24B 37/245; B24B 37/26; B24D 3/001; B24D 3/002; B24D 3/28; B24D 3/32
 See application file for complete search history.

(56) References Cited

U.S. PATENT DOCUMENTS

| | | | |
|---|---|---|---|
| 7,192,340 B2 | 3/2007 | Ono et al. | |
| 7,470,170 B2 | 12/2008 | Shimomura et al. | |
| 2004/0055223 A1* | 3/2004 | Ono ........................ | B24D 3/28 51/293 |

(Continued)

FOREIGN PATENT DOCUMENTS

| | | |
|---|---|---|
| JP | 2005-46960 A | 2/2005 |
| KR | 10-0857504 B1 | 9/2008 |
| KR | 10-1107842 B1 | 1/2012 |

OTHER PUBLICATIONS

MiSUMi. "FAQ." <https://us.misumi-ec.com/maker/misumi/mech/product/ur/faq/>. Accessed Mar. 24, 2022. (Year: 2022).*

*Primary Examiner* — Joel D Crandall
(74) *Attorney, Agent, or Firm* — Sughrue Mion, PLLC

(57) ABSTRACT

Embodiments relate to a polishing pad for use in a chemical mechanical planarization (CMP) process of semiconductor devices. The polishing pad may secure excellent polishing rate and within-wafer non-uniformity by controlling the physical properties such as initial load resistivity and compressive elasticity of the cushion layer and/or the laminate as defined by Equations 1 and 2:

$$LR_L(\%) = \frac{T1L - T2L}{T1L - T3L} \times 100 \qquad \text{[Equation 1]}$$

$$CE_L(\%) = \frac{T4L - T3L}{T2L - T3L} \times 100. \qquad \text{[Equation 2]}$$

14 Claims, 1 Drawing Sheet

(56) References Cited

U.S. PATENT DOCUMENTS

| | | | | |
|---|---|---|---|---|
| 2004/0102141 A1* | 5/2004 | Swisher | ................ | B24B 37/205 451/41 |
| 2004/0259484 A1* | 12/2004 | Prasad | .................... | B24D 3/32 451/287 |
| 2005/0055885 A1* | 3/2005 | Obeng | .................. | B24D 3/348 51/293 |
| 2005/0064709 A1* | 3/2005 | Shimomura | ........... | C08G 18/10 438/689 |
| 2006/0037699 A1* | 2/2006 | Nakamori | ............. | B24B 37/013 156/345.12 |
| 2007/0010169 A1* | 1/2007 | Swisher | ................ | B24B 37/205 451/526 |
| 2007/0178812 A1* | 8/2007 | Shimomura | ............. | B24D 3/24 451/41 |
| 2009/0075568 A1* | 3/2009 | Kimura | .................. | B24B 37/26 51/293 |
| 2009/0253353 A1* | 10/2009 | Ogawa | ................. | B24B 37/205 428/218 |
| 2014/0033615 A1* | 2/2014 | Itoyama | ................. | B24B 37/24 51/296 |
| 2014/0141704 A1* | 5/2014 | Takeuchi | ............... | B24D 11/00 451/529 |
| 2014/0170943 A1* | 6/2014 | Takeuchi | ............... | B24B 37/26 451/527 |
| 2017/0144266 A1* | 5/2017 | Sato | ........................ | B24B 37/26 |

* cited by examiner

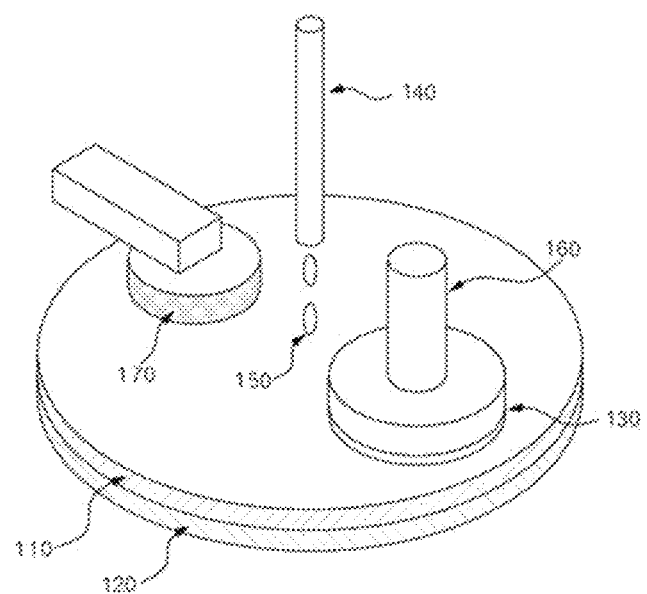

POLISHING PAD AND METHOD FOR PREPARING SEMICONDUCTOR DEVICE USING SAME

CROSS REFERENCE TO RELATED APPLICATIONS

This Application claims priority from Korean Patent Application 10-2020-0032692, filed on Mar. 17, 2020 and from Korean Patent Application 10-2020-0032878, filed on Mar. 17, 2020, the disclosures of which are incorporated herein by reference in its entireties.

TECHNICAL FIELD

Embodiments relate to a polishing pad for use in a chemical mechanical planarization (CMP) process of semiconductor devices.

BACKGROUND ART

In recent years, the semiconductor market has been further broadened, and the use of chemical mechanical polishing pads is also increasing. A chemical mechanical polishing pad is a polishing pad for use in a chemical mechanical planarization (CMP) process that chemically and mechanically polishes the surface of a semiconductor substrate such as a wafer. It is one of the important process factors that determine the resulting surface characteristics of a semiconductor substrate.

The chemical mechanical planarization (CMP) process in a process for preparing semiconductors refers to a step in which a semiconductor substrate is fixed to a head and in contact with the surface of a polishing pad mounted on a platen, and the wafer is then chemically treated by supplying a slurry while the platen and the head are relatively moved, to thereby mechanically planarize the irregularities on the semiconductor substrate.

In such a CMP process, the semiconductor substrate is polished in a wet environment while a predetermined pressure is applied to the surface of the polishing pad and a polishing slurry is also applied thereto. Thus, the compression characteristics and wetting characteristics of the polishing pad are one of the very important factors among the various factors that determine the surface characteristics of a semiconductor substrate.

Accordingly, research is continuously required for enhancing the polishing characteristics of the CMP process by controlling the physical properties related to the compression and wetting characteristics of a polishing layer, a cushion layer, and/or a laminate.

PRIOR ART DOCUMENT

Patent Document (Patent Document 1) Korean Patent No. 1107842

DISCLOSURE OF THE INVENTION

Technical Problem to be Solved

The embodiments aim to provide a polishing pad having excellent polishing characteristics such as polishing rate and within-wafer non-uniformity for silicon oxide and tungsten.

Solution to the Problem

The polishing pad according to an embodiment comprises a laminate composed of a polishing layer, an adhesive layer, and a cushion layer, wherein a initial load resistivity ($LR_L$) of the laminate defined by the following Equation 1 is 88% or more:

$$LR_L(\%) = \frac{T1L - T2L}{T1L - T3L} \times 100 \qquad \text{[Equation 1]}$$

In Equation 1, the $T1_L$ is the thickness of the laminate in the no-load state, the $T2_L$ is the thickness of the laminate when a stress load of 30 kPa is maintained for 60 seconds from the no-load state, and the $T3_L$ is the thickness of the laminate when a stress load of 50 kPa is maintained for 60 seconds from the $T2_L$ state.

The polishing pad according to another embodiment comprises a polishing layer and a cushion layer, wherein a initial load resistivity ($LR_C$) of the cushion layer defined by the following Equation 5 is 45% or more:

$$LR_C(\%) = \frac{T1C - T2C}{T1C - T3C} \times 100 \qquad \text{[Equation 5]}$$

In Equation 5, the $T1_C$ is the thickness of the cushion layer in the no-load state, the $T2_C$ is the thickness of the cushion layer when a stress load of 30 kPa is maintained for 60 seconds from the no-load state, and the $T3_C$ is the thickness of the cushion layer when a stress load of 50 kPa is maintained for 60 seconds from the $T2_C$ state.

The process for preparing a semiconductor device according to still another embodiment comprises preparing a polishing pad comprising a laminate composed of a polishing layer, an adhesive layer, and a cushion layer; and relatively rotating the surface of the polishing layer of the polishing pad and the surface of a wafer while they are in contact with each other to polish the surface of the wafer, wherein the initial load resistivity ($LR_L$) of the laminate defined by Equation 1 is 88% or more.

Advantageous Effects of the Invention

The polishing pad according to the embodiment may secure excellent polishing rate and within-wafer non-uniformity by controlling the physical properties such as resistance characteristics, compressive elastic characteristics, and the like of the cushion layer and/or the laminate.

Accordingly, when the polishing pad according to the embodiment is used, it is possible to reduce the occurrence of defects such as scratches on an object to be polished and to improve the polishing precision by suppressing non-uniform polishing, thereby providing a semiconductor device of high quality.

BRIEF DESCRIPTION OF THE DRAWINGS

FIG. 1 schematically illustrates the process for preparing a semiconductor device according to an embodiment.

DETAILED DESCRIPTION FOR CARRYING OUT THE INVENTION

Hereinafter, the embodiments will be described in detail with reference to the accompanying drawings so that those of ordinary skill in the art to which the present invention pertains can easily implement the present invention. However, the embodiments may be implemented in various different forms and are not limited to those described in the present specification.

Throughout the present specification, when a part is referred to as "comprising" an element, it is understood that other elements may be comprised, rather than other elements are excluded, unless specifically stated otherwise.

In this specification, singular forms are to be interpreted as a meaning to encompass the singular or plural interpreted in context, unless the context describes otherwise.

In addition, all numbers and expressions related to the quantities of components, reaction conditions, and the like used herein are to be understood as being modified by the term "about," unless otherwise indicated.

<Polishing Pad>

An embodiment provides a polishing pad having excellent polishing characteristics such as polishing rate and within-wafer non-uniformity for tungsten.

The polishing pad according to an embodiment comprises a laminate composed of a polishing layer, an adhesive layer, and a cushion layer, wherein a initial load resistivity ($LR_L$) of the laminate defined by the following Equation 1 is 88% or more:

$$LR_L(\%) = \frac{T1L - T2L}{T1L - T3L} \times 100 \quad \text{[Equation 1]}$$

In Equation 1, the $T1_L$ is the thickness of the laminate in the no-load state, the $T2_L$ is the thickness of the laminate when a stress load of 30 kPa is maintained for 60 seconds from the no-load state, and the $T3_L$ is the thickness of the laminate when a stress load of 50 kPa is maintained for 60 seconds from the $T2_L$ state.

Specifically, the initial load resistivity ($LR_L$) of the laminate may be 88.5% or more, 89% or more, 89.5% or more, 90% or more, 90.5% or more, 91% or more, 88% to 98%, 88% to 97%, 88% to 96%, 90% to 98%, or 91% to 97%, but it is not limited thereto.

The initial load resistivity ($LR_L$) is a parameter representing the ratio of the degree of change in thickness of the laminate when a weak force and a strong force are applied.

A polishing pad in which a laminate having an initial load resistivity ($LR_L$) satisfying the above range is employed may have a supporting force capable of securing excellent polishing performance while scratches formed on an object to be polished are minimized.

In a polishing pad in which a laminate having an initial load resistivity ($LR_L$) outside the above range is employed, scratches may be formed on an object to be polished, thereby deteriorating its quality, or the polishing performance such as polishing rate or within-wafer non-uniformity may be deteriorated.

That is, as the initial load resistivity ($LR_L$) of the laminate satisfies the above range, it is possible for the polishing pad thus prepared to minimize scratches formed on an object to be polished, as well as it is easy to planarize materials requiring high surface flatness such as silicon wafers by virtue of its excellent polishing rate and polishing within-wafer non-uniformity.

The laminate employed in the polishing pad according to another embodiment has a compressive elasticity ($CE_L$) of 50% or more defined by the following Equation 2.

$$CE_L(\%) = \frac{T4L - T3L}{T2L - T3L} \times 100 \quad \text{[Equation 2]}$$

In Equation 2, the $T2_L$ is the thickness of the laminate when a stress load of 30 kPa is maintained for 60 seconds from the no-load state, the $T3_L$ is the thickness of the laminate when a stress load of 50 kPa is maintained for 60 seconds from the $T2_L$ state, and the $T4_L$ is the thickness of the laminate when the laminate is left for 60 seconds after the stress load has been released from the $T3_L$ state, and a stress load of 30 kPa is then maintained for 60 seconds.

Specifically, the compressive elasticity ($CE_L$) of the laminate may be 55% or more, 58% or more, 60% or more, 63% or more, 65% or more, 68% or more, 70% or more, 50% to 98%, 60% to 98%, 65% to 98%, 70% to 98%, 60% to 95%, 70% to 95%, or 70% to 92%, but it is not limited thereto.

The compressive elasticity ($CE_L$) is a parameter related to the degree of recovery after a strong force is applied to a laminate composed of a polishing layer, an adhesive layer, and a cushion layer for a certain period of time.

A polishing pad in which a laminate having a compressive elasticity ($CE_L$) satisfying the above range is employed may secure excellent polishing performance even after use for a long period of time while scratches formed on an object to be polished are minimized.

In a polishing pad in which a laminate having a compressive elasticity ($CE_L$) outside the above range is employed, the polishing performance may be inconsistent as the polishing performance is sharply deteriorated when it is used for a long period of time. Or scratches may be formed on an object to be polished, thereby deteriorating its quality.

That is, in the case of a polishing pad comprising a laminate whose compressive elasticity ($CE_L$) satisfies the above range, it is possible to minimize defects such as scratches formed on an object to be polished, to maintain constant polishing performance, and to secure excellent polishing rate and polishing within-wafer non-uniformity.

The initial load resistivity ($LR_L$) and compressive elasticity ($CE_L$) of a laminate can be designed by comprehensively controlling not only the material and composition of the laminate, but also the mechanical properties, physical structures, and process conditions, post-processing conditions, and storage/aging conditions, to be described below, of the polishing layer, adhesive layer, and cushion layer employed in the laminate.

The polishing pad according to an embodiment comprises a laminate, and the laminate is composed of a polishing layer, an adhesive layer, and a cushion layer.

The polishing layer performs polishing in contact with a semiconductor substrate in a polishing process.

The polishing layer may comprise a urethane-based polymer. The urethane-based polymer may be formed by a curing reaction between a urethane-based prepolymer and a curing agent. Specifically, the polishing layer comprises a cured product of a composition comprising a urethane-based prepolymer, a curing agent, and a foaming agent, but it is not limited thereto.

A prepolymer generally refers to a polymer having a relatively low molecular weight wherein the degree of polymerization is adjusted to an intermediate level so as to conveniently mold a molded article to be finally produced. Such a prepolymer may be molded by itself or after a reaction with another polymerizable compound.

Specifically, the urethane-based prepolymer comprises a reaction product of at least one isocyanate compound and at least one polyol. In addition, the urethane-based prepolymer may be prepared by reacting an isocyanate compound with a polyol and may comprise an unreacted isocyanate group (NCO). The isocyanate compound and the polyol compound are not particularly limited as long as they can be used for preparing a urethane-based polymer.

For example, the isocyanate compound used in the preparation of the urethane-based prepolymer may be at least one isocyanate selected from the group consisting of toluene diisocyanate (TDI), naphthalene-1,5-diisocyanate, p-phenylene diisocyanate, tolidine diisocyanate, 4,4'-diphenylmethane diisocyanate, hexamethylene diisocyanate (HDI), dicyclohexylmethane diisocyanate, methylene diphenyl diisocyanate (MDI), 1-isocyanato-4-[(4-isocyanatocyclohexyl)methyl]cyclohexane (H12MDI), and isophorone diisocyanate, but it is not limited thereto.

In addition, the polyol used in the preparation of the urethane-based prepolymer refers to a compound that comprises two or more hydroxyl groups. It may comprise a polymer-type polyol and a single-molecule-type polyol.

For example, the polymer-type polyol may be at least one polyol selected from the group consisting of a polyether polyol, a polyester polyol, a polycarbonate polyol, and a polycaprolactone polyol. The polymer-type polyol may have a weight average molecular weight (Mw) of 300 to 3,000 g/mole.

In addition, the single-molecule-type polyol may be at least one selected from the group consisting of ethylene glycol (EG), diethylene glycol (DEG), propylene glycol (PG), propanediol (PDO), and methyl propanediol (MPdiol), but it is not limited thereto.

The urethane-based prepolymer has an isocyanate end group content (NCO %) of 6% by weight to 12% by weight, 6% by weight to 11% by weight, 6% by weight to 10% by weight, or 8% by weight to 10% by weight.

The urethane-based prepolymer may have a weight average molecular weight (Mw) of 300 g/mole to 3,000 g/mole, 500 g/mole to 2,500 g/mole, or 700 g/mole to 2,000 g/mole.

The curing agent may be at least one selected from the group consisting of an amine compound and an alcohol compound. Specifically, the curing agent may comprise at least one compound selected from the group consisting of an aromatic amine, an aliphatic amine, an aromatic alcohol, and an aliphatic alcohol.

For example, the curing agent may be at least one selected from the group consisting of 4,4'-methylenebis(2-chloroaniline) (MOCA), diethyltoluenediamine (DETDA), bis(4-amino-3-chlorophenyl)methane, diaminodiphenyl methane, diaminodiphenyl sulphone, m-xylylene diamine, isophorone diamine, ethylenediamine, diethylenetriamine, triethylenetetramine, polypropylenediamine, polypropylenetriamine, ethylene glycol, diethylene glycol, dipropylene glycol, butanediol, hexanediol, glycerin, and trimethylolpropane.

The foaming agent is not particularly limited as long as it is commonly used for forming pores in a polishing pad. For example, the foaming agent may be at least one selected from a solid phase foaming agent having a hollow structure, a liquid phase foaming agent using a volatile liquid, and a gas phase foaming agent such as an inert gas. Specifically, the foaming agent may be at least one selected from the group consisting of a solid phase foaming agent and a gas phase foaming agent, but it is not limited thereto.

The solid phase foaming agent may be microcapsules (hereinafter, referred to as "thermally expanded microcapsules"), whose size has been adjusted by a thermal expansion. The thermally expanded microcapsules may be obtained by thermally expanding thermally expandable microcapsules. Since the thermally expanded microcapsules in a structure of already expanded micro-balloons have a uniform particle diameter, they have the advantage that the diameter of pores can be controlled to be uniform. Specifically, the solid phase foaming agent may be in a structure of micro-balloons having an average particle diameter of 5 μm to 200 μm.

The thermally expandable microcapsule may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic-based copolymer. Furthermore, the foaming agent may be at least one selected from the group consisting of hydrocarbons having 1 to 7 carbon atoms.

The solid phase foaming agent may be employed in an amount of 0.1 part by weight to 3.0 parts by weight based on 100 parts by weight of the urethane-based prepolymer. Specifically, the solid phase foaming agent may be employed in an amount of 0.5 part by weight to 2.5 parts by weight or 0.8 part by weight to 2.2 parts by weight, based on 100 parts by weight of the urethane-based prepolymer.

The gas phase foaming agent may comprise an inert gas. The kind of the inert gas is not particularly limited as long as it is a gas that does not participate in the reaction between the urethane-based prepolymer and the epoxy curing agents. For example, the inert gas may be at least one selected from the group consisting of nitrogen gas ($N_2$), carbon dioxide gas ($CO_2$), argon gas (Ar), and helium (He). Specifically, the inert gas may be nitrogen gas ($N_2$) or carbon dioxide gas ($CO_2$).

The inert gas may be fed in a volume of 10% to 30% based on the total volume of the composition. Specifically, the inert gas may be fed in a volume of 15% to 30% based on the total volume of the composition.

The composition may optionally further comprise a surfactant.

The surfactant may act to prevent the pores to be formed from overlapping and coalescing with each other. Specifically, the surfactant is preferably a silicone-based nonionic surfactant. But other surfactants may be variously selected depending on the physical properties required for the polishing pad.

As the silicone-based nonionic surfactant, a silicone-based nonionic surfactant having a hydroxyl group may be used alone or in combination with a silicone-based nonionic surfactant having no hydroxyl group.

The silicone-based nonionic surfactant having a hydroxyl group is not particularly limited as long as it is widely used in the polyurethane technology industry since it is excellent in compatibility with an isocyanate-containing compound and an active hydrogen compound. Examples of the silicone-based nonionic surfactant having a hydroxyl group, which is commercially available, include DOW CORNING 193 (a silicone glycol copolymer in a liquid phase having a specific gravity at 25° C. of 1.07, a viscosity at 20° C. of 465 $mm^2/s$, and a flash point of 92° C.) (hereinafter referred to as DC-193) manufactured by Dow Corning.

Examples of the silicone-based nonionic surfactant having no hydroxyl group, which is commercially available, include DOW CORNING 190 (a silicone glycol copolymer having a Gardner color number of 2, a specific gravity at 25° C. of 1.037, a viscosity at 25° C. of 2,000 $mm^2/s$, a flash point of 63° C. or higher, and an inverse solubility point (1.0% water solution) of 36° C. (hereinafter referred to as DC-190) manufactured by Dow Corning.

The surfactant may be employed in an amount of 0.1 part by weight to 2.0 parts by weight based on 100 parts by weight of the urethane-based prepolymer. Specifically, the surfactant may be employed in an amount of 0.2 part by weight to 1.5 parts by weight based on 100 parts by weight of the urethane-based prepolymer. If the amount of the surfactant is within the above range, pores derived from the gas phase foaming agent can be stably formed and maintained in the mold.

The thickness$_L$ of the polishing layer is not particularly limited. Specifically, the average thickness of the polishing layer may be 0.5 mm to 4.0 mm, 1.0 mm to 4.0 mm, 1.0 mm to 3.0 mm, 1.5 mm to 3.0 mm, 1.7 mm to 2.7 mm, or 2.0 mm to 3.5 mm.

The polishing layer may have a hardness$_L$ of 30 Shore D to 80 Shore D. Specifically, the hardness$_L$ of the polishing layer may be 40 Shore D to 80 Shore D, 50 Shore D to 80 Shore D, 40 Shore D to 70 Shore D, 50 Shore D to 70 Shore D, or 55 Shore D to 65 Shore D, but it is not limited thereto.

The polishing layer may comprise a plurality of pores. In such event, the average pore size$_L$ is 5 μm to 50 μm. Specifically, the average pore size$_L$ may be 5 μm to 40 μm, 10 μm to 40 μm, or 10 μm to 30 μm, but it is not limited thereto.

The cushion layer serves to support the polishing layer and to absorb and disperse an impact applied to the polishing layer.

The cushion layer may comprise a nonwoven fabric or a suede, but it is not limited thereto.

In an embodiment, the cushion layer may be a resin-impregnated nonwoven fabric. The nonwoven fabric may be a fibrous nonwoven fabric comprising one selected from the group consisting of a polyester fiber, a polyamide fiber, a polypropylene fiber, a polyethylene fiber, and a combination thereof.

The resin impregnated in the nonwoven fabric may comprise a polyurethane resin, a polybutadiene resin, a styrene-butadiene copolymer resin, a styrene-butadiene-styrene copolymer resin, an acrylonitrile-butadiene copolymer resin, a styrene-ethylene-butadiene-styrene copolymer resin, a silicone rubber resin, a polyester-based elastomer resin, a polyamide-based elastomer resin, and a combination thereof.

A thickness$_L$ of the cushion layer is 0.5 to 2.5 mm. Specifically, the thickness$_L$ of the cushion layer may be 0.8 to 2.5 mm, 1.0 to 2.5 mm, 1.0 to 2.0 mm, 1.2 to 1.8 mm, 1.2 to 1.5 mm, or 1.2 to 1.4 mm, but it is not limited thereto.

A hardness$_L$ of the cushion layer may be 68 to 74 Asker C, 69 to 74 Asker C, 70 to 74 Asker C, or 71 to 74 Asker C, but it is not limited thereto.

A density$_L$ of the cushion layer may be about 0.1 g/cm$^3$ to about 0.6 g/cm$^3$, for example, about 0.1 g/cm$^3$ to about 0.5 g/cm$^3$, for example, about 0.1 g/cm$^3$ to about 0.4 g/cm$^3$, for example, about 0.2 g/cm$^3$ to about 0.4 g/cm$^3$.

The cushion layer was subjected to measurements for a initial thickness (D1$_L$), a thickness (D2$_L$) after a weight of 800 g was applied for 3 minutes, and a thickness (D3$_L$) after a restoration time of 1 minute passed. In such event, a compressibility$_L$ of the cushion layer derived by the following Equation 3 may be about 5% to about 15%, for example, about 8% to about 14%, for example, about 10% to about 14%.

$$\text{Compressibility}_L(\%) = (D1_L - D2_L)/D1_L \times 100 \quad \text{[Equation 3]}$$

The cushion layer was subjected to measurements for the initial thickness (D1$_L$), a thickness (D4$_L$) after a weight of 800 g was applied for 1 minute, and a thickness (D5$_L$) after a restoration time of 1 minute passed. In such event, a elasticity$_L$ of the cushion layer derived by the following Equation 4 may be about 91% or less, for example, about 65% to about 91%, for example, about 70% to about 91%, for example, about 80% to about 90%.

$$\text{Elasticity}_L(\%) = (D5_L - D4_L)/(D1_L - D4_L) \times 100 \quad \text{[Equation 4]}$$

If the laminate satisfies the above ranges of an initial load resistivity (LR$_L$) according to Equation 1 and a compressive elasticity (CE$_L$) according to Equation 2, and if the cushion layer satisfies the above ranges of a compressibility$_L$ according to Equation 3 and an elasticity$_L$ according to Equation 4 at the same time, it may be laminated with the polishing layer to achieve a desired polishing performance. The initial load resistivity (LR$_L$), compressive elasticity (CE$_L$), compressibility$_L$, and elasticity$_L$ can be designed by comprehensively controlling not only the cushion layer and the material and composition of the laminate, but also the process conditions, post-processing conditions, and storage/aging conditions of the cushion layer.

The laminate employed in the polishing pad according to an embodiment may be composed of a polishing layer, an adhesive layer, and a cushion layer, wherein the adhesive layer may be interposed between the polishing layer and the cushion layer.

In addition, the adhesive layer may comprise a hot melt adhesive.

The hot melt adhesive may be at least one selected from the group consisting of a polyurethane resin, a polyester resin, an ethylene-vinyl acetate resin, a polyamide resin, and a polyolefin resin. Specifically, the hot melt adhesive may be at least one selected from the group consisting of a polyurethane resin and a polyester resin.

A elastic modulus$_L$ of the polishing pad according to an embodiment may be 100 to 160 kgf/cm$^2$. More specifically, the elastic modulus$_L$ of the polishing pad may be 100 to 150 kgf/cm$^2$, 100 to 140 kgf/cm$^2$, or 100 to 130 kgf/cm$^2$, but it is not limited thereto.

If the elastic modulus$_L$ is within the above range, it is possible to provide a polishing pad capable of achieving high polishing planarization characteristics and uniformity with a high polishing speed.

In addition, the polishing pad according to an embodiment comprises a laminate composed of a polishing layer, an adhesive layer, and a cushion layer, wherein the laminate satisfies the above ranges of an initial load resistivity (LR$_L$) and a compressive elasticity (CE$_L$).

The polishing pad according to an embodiment may secure excellent polishing rate and within-wafer non-uniformity by controlling the initial load resistivity (LR$_L$) and compressive elasticity (CE$_L$) of the laminate to the above ranges.

The thickness (T1$_L$) of the laminate in the no-load state is 2.0 to 4.5 mm. Specifically, the thickness (T1$_L$) of the laminate in the no-load state may be 2.0 to 4.2 mm, 2.5 to 4.2 mm, 2.8 to 4.2 mm, 3.0 to 4.0 mm, 3.2 to 3.8 mm, or 3.2 to 3.6 mm, but it is not limited thereto.

The polishing pad according to an embodiment may have a polishing rate of 3,840 Å/min or less for tungsten (W). The polishing rate (Å/min) may be obtained by dividing a polished thickness (Å) of a silicon wafer by a polishing time (minute).

Specifically, the polishing rate of the polishing pad for tungsten (W) may be 100 Å/min to 3,840 Å/min, 200 Å/min to 3,840 Å/min, 500 Å/min to 3,840 Å/min, 700 Å/min to 3,840 Å/min, 1,000 Å/min to 3,840 Å/min, 1,500 Å/min to 3,840 Å/min, 2,000 Å/min to 3,840 Å/min, or 2,500 Å/min to 3,840 Å/min, but it is not limited thereto.

If the polishing rate of the polishing pad is outside the above range, defects such as scratches may be formed on an object to be polished, or the polishing performance may be deteriorated.

In addition, the polishing pad according to an embodiment may have a within-wafer non-uniformity (WIWNU) of 4.3% or less for tungsten (W). The within-wafer non-uniformity may be obtained by the following equation.

Within-wafer non-uniformity(WIWNU) (%)=(standard deviation of polished thickness(Å)/average polished thickness(Å))×100(%)

Specifically, the within-wafer non-uniformity of the polishing pad for tungsten (W) may be 5.5% or less, 4.2% or less, 4.1% or less, 4.0% or less, or 3.9% or less, but it is not limited thereto.

If the within-wafer non-uniformity of the polishing pad is within the above range, it is easy to planarize the surface of an object to be polished requiring high surface flatness, and it is possible to provide a semiconductor device of excellent quality.

The features of the components and characteristics of the polishing pad described above may be combined with each other.

Another embodiment provides a polishing pad having excellent polishing characteristics such as polishing rate and within-wafer non-uniformity for silicon oxide.

The polishing pad according to another embodiment comprises a polishing layer and a cushion layer, wherein a initial load resistivity ($LR_C$) of the cushion layer defined by the following Equation 5 is 45% or more.

$$LRc(\%) = \frac{T1c - T2c}{T1c - T3c} \times 100 \qquad [\text{Equation 5}]$$

In Equation 5, the $T1_C$ is the thickness of the cushion layer in the no-load state, the $T2_C$ is the thickness of the cushion layer when a stress load of 30 kPa is maintained for 60 seconds from the no-load state, and the $T3_C$ is the thickness of the cushion layer when a stress load of 50 kPa is maintained for 60 seconds from the $T2_C$ state.

Specifically, the initial load resistivity ($LR_C$) of the cushion layer may be 50% or more, 55% or more, 60% or more, 65% or more, 70% or more, 75% or more, 45% to 98%, 45% to 95%, 45% to 90%, 50% to 90%, 60% to 90%, or 70% to 90%, but it is not limited thereto.

The initial load resistivity ($LR_C$) is a parameter representing the ratio of the degree of change in thickness of the cushion layer when a weak force and a strong force are applied.

A polishing pad in which a cushion layer having an initial load resistivity ($LR_C$) satisfying the above range is employed may have a supporting force capable of securing excellent polishing performance while scratches formed on an object to be polished are minimized.

In a polishing pad in which a cushion layer having an initial load resistivity ($LR_C$) outside the above range is employed, scratches may be formed on an object to be polished, thereby deteriorating its quality, or the polishing rate may be deteriorated.

That is, as the initial load resistivity ($LR_C$) of the cushion layer satisfies the above range, it is possible for the polishing pad thus prepared to minimize scratches formed on an object to be polished, as well as it is easy to planarize materials requiring high surface flatness such as silicon wafers by virtue of its excellent polishing rate and polishing within-wafer non-uniformity.

The cushion layer employed in the polishing pad according to another embodiment has a compressive elasticity ($CE_C$) of less than 90% defined by the following Equation 6.

$$CEc(\%) = \frac{T4c - T3c}{T2c - T3c} \times 100 \qquad [\text{Equation 6}]$$

In Equation 6, the $T2_C$ is the thickness of the cushion layer when a stress load of 30 kPa is maintained for 60 seconds from the no-load state, the $T3_C$ is the thickness of the cushion layer when a stress load of 50 kPa is maintained for 60 seconds from the $T2_C$ state, and the $T4_C$ is the thickness of the cushion layer when the cushion layer is left for 60 seconds after the stress load has been released from the $T3_C$ state, and a stress load of 30 kPa (300 g/cm²) is then maintained for 60 seconds.

Specifically, the compressive elasticity ($CE_C$) of the cushion layer may be 89.8% or less, 88% or less, 80% or less, 10% to less than 90%, 20% to less than 90%, 30% to less than 90%, 40% to less than 90%, 20% to 85%, 20% to 80%, 30% to 80%, or 40% to 80%, but it is not limited thereto.

The compressive elasticity ($CE_C$) is a parameter related to the degree of recovery after a strong force is applied to a cushion layer for a certain period of time.

A polishing pad in which a cushion layer having a compressive elasticity ($CE_C$) satisfying the above range is employed may secure excellent polishing performance even after use for a long period of time while scratches formed on an object to be polished are minimized.

In a polishing pad in which a cushion layer having a compressive elasticity ($CE_C$) outside the above range is employed, scratches may be formed on an object to be polished, thereby deteriorating its quality, or the polishing performance may be inconsistent.

That is, in the case of a polishing pad comprising a cushion layer whose compressive elasticity ($CE_C$) satisfies the above range, it is possible to minimize defects such as scratches formed on an object to be polished, to maintain constant polishing performance, and to secure excellent polishing rate and polishing within-wafer non-uniformity.

The polishing pad according to an embodiment comprises a polishing layer.

The polishing layer performs polishing in contact with a semiconductor substrate in a polishing process.

The polishing layer may comprise a urethane-based polymer. The urethane-based polymer may be formed by a curing reaction between a urethane-based prepolymer and a curing agent. Specifically, the polishing layer comprises a cured product of a composition comprising a urethane-based prepolymer, a curing agent, and a foaming agent, but it is not limited thereto.

Details on the prepolymer, the curing agent, and the foaming agent are the same as described above.

In addition, the composition may optionally further comprise a surfactant, and details on the surfactant are the same as described above.

A thickness$_C$ of the polishing layer is not particularly limited. Specifically, the average thickness$_C$ of the polishing layer may be 0.8 mm to 5.0 mm, 1.0 mm to 4.0 mm, 1.0 mm to 3.0 mm, 1.5 mm to 3.0 mm, 1.7 mm to 2.7 mm, or 2.0 mm to 3.5 mm.

The polishing layer may have a hardness$_C$ of 30 Shore D to 80 Shore D. Specifically, the hardness$_C$ of the polishing layer may be 40 Shore D to 80 Shore D, 50 Shore D to 80 Shore D, 40 Shore D to 70 Shore D, 50 Shore D to 70 Shore D, or 55 Shore D to 65 Shore D, but it is not limited thereto.

The polishing layer may comprise a plurality of pores. In such event, the average pore size$_C$ is 5 μm to 50 μm. Specifically, the average pore size$_C$ may be 5 μm to 40 μm, 10 μm to 40 μm, or 10 μm to 30 μm, but it is not limited thereto.

The polishing pad according to an embodiment comprises a cushion layer.

The cushion layer serves to support the polishing layer and to absorb and disperse an impact applied to the polishing layer.

The cushion layer may comprise a nonwoven fabric or a suede, but it is not limited thereto.

Details on the type, ingredients, and the like of the cushion layer are the same as described above.

The cushion layer satisfies the above ranges of an initial load resistivity (LR$_C$) and a compressive elasticity (CE$_C$).

The polishing pad according to an embodiment may secure excellent polishing rate and within-wafer non-uniformity by controlling the initial load resistivity (LR$_C$) and compressive elasticity (CE$_C$) of the cushion layer to the above ranges.

The thickness (T1$_C$) of the cushion layer in the no-load state is 0.5 to 2.5 mm. Specifically, the thickness (T1$_C$) of the cushion layer in the no-load state may be 0.8 to 2.5 mm, 1.0 to 2.5 mm, 1.0 to 2.0 mm, 1.2 to 1.8 mm, or 1.2 to 1.4 mm, but it is not limited thereto.

The initial load resistivity (LR$_C$) and compressive elasticity (CE$_C$) of a cushion layer can be designed by comprehensively controlling not only the material and composition of the cushion layer, but also the mechanical properties, physical structures, and process conditions, post-processing conditions, and storage/aging conditions, to be described below, of the cushion layer.

In still another embodiment, a hardness$_C$ of the cushion layer may be 69 to 80 Asker C, 69 to 78 Asker C, or 69 to 75 Asker C, but it is not limited thereto.

A density$_C$ of the cushion layer may be about 0.1 g/cm$^3$ to about 0.6 g/cm$^3$, for example, about 0.1 g/cm$^3$ to about 0.5 g/cm$^3$, for example, about 0.1 g/cm$^3$ to about 0.4 g/cm$^3$, for example, about 0.2 g/cm$^3$ to about 0.4 g/cm$^3$.

The cushion layer was subjected to measurements for a initial thickness (D1$_C$), a thickness (D2$_C$) after a weight of 800 g was applied for 3 minutes, and a thickness (D3$_C$) after a restoration time of 1 minute passed. In such event, a compressibility$_C$ of the cushion layer derived by the following Equation 7 may be about 5% to about 15%, for example, about 8% to about 14%, for example, about 10% to about 14%.

$$Compressibiltiy_C(\%) = \frac{D1c - D2c}{D1c} \times 100 \quad \text{[Equation 7]}$$

The cushion layer was subjected to measurements for the initial thickness (D1$_C$), a thickness (D4$_C$) after a weight of 800 g was applied for 1 minutes, and a thickness (D5$_C$) after a restoration time of 1 minute passed. In such event, a elasticity$_C$ of the cushion layer derived by the following Equation 8 may be about 91% or less, for example, about 65% to about 91%, for example, about 70% to about 91%, for example, about 80% to about 90%.

$$Elasticity_C(\%) = \frac{D5c - D4c}{D1c - D4c} \times 100 \quad \text{[Equation 8]}$$

If the cushion layer satisfies the above ranges of an initial load resistivity (LR$_C$) according to Equation 5 and a compressive elasticity (CE$_C$) according to Equation 6, and if it satisfies the above ranges of a compressibility$_C$ according to Equation 7 and an elasticity$_C$ according to Equation 8 at the same time, it may be laminated with the polishing layer to achieve a desired polishing performance. The initial load resistivity (LR$_C$), compressive elasticity (CE$_C$), compressibility$_C$, and elasticity$_C$ can be designed by comprehensively controlling not only the material and composition of the cushion layer, but also the process conditions, post-processing conditions, and storage/aging conditions of the cushion layer.

The polishing pad according to an embodiment further comprises an adhesive layer between the polishing layer and the cushion layer. The adhesive layer may comprise a hot-melt adhesive as described above, but it is not limited thereto.

A elastic modulus$_C$ of the polishing pad according to an embodiment may be 80 to 170 kgf/cm$^2$. Specifically, the elastic modulus$_C$ of the polishing pad may be 90 to 170 kgf/cm$^2$ or 100 to 170 kgf/cm$^2$, but it is not limited thereto.

The polishing pad according to an embodiment may have a polishing rate of 2,700 Å/min or less for silicon oxide (SiO$_x$). The polishing rate (Å/min) may be obtained by dividing the polished thickness (Å) of a silicon wafer by the polishing time (minute).

Specifically, the polishing rate of the polishing pad for silicon oxide (SiO$_x$) may be 100 Å/min to 2,700 Å/min, 200 Å/min to 2,700 Å/min, 500 Å/min to 2,700 Å/min, 700 Å/min to 2,700 Å/min, 1,000 Å/min to 2,700 Å/min, 1,000 Å/min to 2,600 Å/min, or 1,000 Å/min to 2,500 Å/min, but it is not limited thereto.

If the polishing rate of the polishing pad is outside the above range, defects such as scratches may be formed on an object to be polished, or the polishing performance may be deteriorated.

In addition, the polishing pad according to an embodiment may have a within-wafer non-uniformity (WIWNU) of 5.5% or less for silicon oxide (SiO$_x$). The within-wafer non-uniformity may be obtained by the above equation for within-wafer non-uniformity.

Specifically, the within-wafer non-uniformity of the polishing pad for silicon oxide (SiO$_x$) may be 5.5% or less, 5.4% or less, 5.3% or less, 5.2% or less, or 5.0% or less, but it is not limited thereto.

If the within-wafer non-uniformity of the polishing pad is within the above range, it is easy to planarize the surface of an object to be polished requiring high surface flatness, and it is possible to provide a semiconductor device of excellent quality.

The features of the components and characteristics of the polishing pad described above may be combined with each other.

<Process for Preparing a Polishing Pad>

The process for preparing a polishing pad according to an embodiment comprises sequentially or simultaneously mixing a urethane-based prepolymer, a curing agent, and a foaming agent to prepare a composition; and injecting the composition into a mold and curing it to form a polishing layer.

The urethane-based prepolymer may comprise a reaction product of at least one isocyanate compound and at least one polyol. Details on the isocyanate compound and the polyol are the same as described above.

In addition, an additive comprising a surfactant may be further added to the composition, if desired. Details on the surfactant are as described above.

As an example, the urethane-based prepolymer, the curing agent, and the foaming agent may be put into the mixing process substantially at the same time. If the foaming agent, the surfactant, and the inert gas are further added, they may be put into the mixing process substantially at the same time.

As another example, the urethane-based prepolymer, the foaming agent, and the surfactant may be mixed in advance, and the curing agent, or the curing agent with the inert gas, may be subsequently introduced.

The mixing may be carried out at a speed of 1,000 to 10,000 rpm or 4,000 to 7,000 rpm. Within the above speed range, it may be more advantageous for the inert gas and the foaming agent to be uniformly dispersed in the composition.

In addition, the step of preparing the composition may be carried out under the condition of 50° C. to 150° C. If necessary, it may be carried out under vacuum defoaming conditions.

The step of injecting the composition into a mold and curing it to form a polishing layer may be carried out under the temperature condition of 60° C. to 150° C. and the pressure condition of 50 kg/m² to 260 kg/m².

In addition, the above preparation process may further comprise the steps of cutting the surface of a polishing pad thus obtained, machining grooves on the surface thereof, bonding with a cushion layer, inspection, packaging, and the like. These steps may be carried out in a conventional manner for preparing a polishing pad.

Details on the polishing pad prepared according to the preparation process described above are as described above.

As the polishing pad is prepared according to the preparation process described above, it may exhibit excellent performance such as polishing rate and polishing within-wafer non-uniformity. In addition, it is possible to minimize defects such as scratches on an object to be polished, to maintain constant polishing performance, and to increase the life span of the polishing pad. Thus, it is easy to planarize the surface of an object to be polished requiring high surface flatness such as a silicon wafer for semiconductor devices, and it is possible to provide a semiconductor device such as semiconductor substrate of excellent quality.

<Process for Preparing a Semiconductor Device>

The process for preparing a semiconductor device according to an embodiment comprises polishing the surface of a semiconductor substrate using the polishing pad according to an embodiment.

Specifically, the process for preparing a semiconductor device according to an embodiment comprises preparing a polishing pad comprising a laminate composed of a polishing layer, an adhesive layer, and a cushion layer; and relatively rotating the surface of the polishing layer of the polishing pad and the surface of a wafer while they are in contact with each other to polish the surface of the wafer, wherein the initial load resistivity (LR) of the laminate defined by the following Equation 1 is 88% or more:

$$LR_L(\%) = \frac{T1L - T2L}{T1L - T3L} \times 100 \quad \text{[Equation 1]}$$

In Equation 1, the $T1_L$ is the thickness of the laminate in the no-load state, the $T2_L$ is the thickness of the laminate when a stress load of 30 kPa is maintained for 60 seconds from the no-load state, and the $T3_L$ is the thickness of the laminate when a stress load of 50 kPa is maintained for 60 seconds from the $T2_L$ state.

The process for preparing a semiconductor device according to another embodiment comprises preparing a polishing pad comprising a polishing layer and a cushion layer; and relatively rotating the surface of the polishing layer of the polishing pad and the surface of a wafer while they are in contact with each other to polish the surface of the wafer, wherein the initial load resistivity ($LR_C$) of the cushion layer defined by the following Equation 5 is 45% or more:

$$LRc(\%) = \frac{T1c - T2c}{T1c - T3c} \times 100 \quad \text{[Equation 5]}$$

In Equation 5, the $T1_C$ is the thickness of the cushion layer in the no-load state, the $T2_C$ is the thickness of the cushion layer when a stress load of 30 kPa is maintained for 60 seconds from the no-load state, and the $T3_C$ is the thickness of the cushion layer when a stress load of 50 kPa is maintained for 60 seconds from the $T2_C$ state.

FIG. 1 schematically illustrates the process for preparing a semiconductor device according to an embodiment. Referring to FIG. 1, once the polishing pad (110) according to an embodiment is attached to a platen (120), a semiconductor substrate (130) is disposed on the polishing pad (110). In such event, the surface of the semiconductor substrate (130) is in direct contact with the polishing surface of the polishing pad (110). A polishing slurry (150) may be sprayed through a nozzle (140) on the polishing pad for polishing. The flow rate of the polishing slurry (150) supplied through the nozzle (140) may be selected according to the purpose within a range of about 10 cm³/min to about 1,000 cm³/min. For example, it may be about 50 cm³/min to about 500 cm³/min, but it is not limited thereto.

Thereafter, the semiconductor substrate (130) and the polishing pad (110) rotate relatively to each other, so that the surface of the semiconductor substrate (130) is polished. In such event, the rotation direction of the semiconductor substrate (130) and the rotation direction of the polishing pad (110) may be the same direction or opposite directions. The rotation speeds of the semiconductor substrate (130) and the polishing pad (110) may be selected according to the purpose within a range of about 10 rpm to about 500 rpm. For example, it may be about 30 rpm to about 200 rpm, but it is not limited thereto.

The semiconductor substrate (130) mounted on the polishing head (160) is pressed against the polishing surface of the polishing pad (110) at a predetermined load to be in contact therewith, the surface thereof may then be polished. The load applied to the polishing surface of the polishing pad (110) through the surface of the semiconductor substrate (130) by the polishing head (160) may be selected according to the purpose within a range of about 1 gf/cm² to about 1,000 gf/cm². For example, it may be about 10 gf/cm² to about 800 gf/cm², but it is not limited thereto.

In an embodiment, in order to maintain the polishing surface of the polishing pad (110) in a state suitable for polishing, the process for preparing a semiconductor device may further comprise processing the polishing surface of the polishing pad (110) with a conditioner (170) simultaneously with polishing the semiconductor substrate (130).

In the polishing pad according to an embodiment, the initial load resistivity ($LR_C$) and initial load resistivity ($LR_L$) of the cushion layer and laminate are adjusted, thereby enhancing the polishing rate and within-wafer non-uniformity for tungsten and silicon oxide. Thus, it is possible to efficiently fabricate a semiconductor device of excellent quality using the polishing pad.

Hereinafter, the present invention is explained in detail by Examples. The following Examples are intended to further illustrate the present invention, and the scope of the Examples is not limited thereto.

EXAMPLE

Example 1

1-1: Configuration of the Device

In a casting machine equipped with feeding lines for a urethane-based prepolymer, a curing agent, an inert gas, and a reaction rate controlling agent, a prepolymer composition (SKC) having an unreacted NCO content of 9.1% by weight was charged to the prepolymer tank, and bis(4-amino-3-chlorophenyl)methane (Ishihara) was charged to the curing agent tank. Nitrogen ($N_2$) was prepared as an inert gas. In addition, 1 part by weight of a solid phase foaming agent (AkzoNobel) and 1 part by weight of a silicone-based surfactant (Evonik) were mixed in advance based on 100 parts by weight of the urethane-based prepolymer and then charged into the prepolymer tank.

1-2: Preparation of a Polishing Pad

The raw materials were stirred while they were fed to the mixing head at constant rates through the respective feeding lines. In such event, the prepolymer and the curing agent were fed at an equivalent ratio of 1:1. Nitrogen ($N_2$), an inert gas, was fed at a rate of 1 liter/min. The mixed raw materials were injected into a mold (1,000 mm×1,000 mm×3 mm) preheated to 120° C. at a charge rate of 10 kg/min and cast at 120° C. to obtain a molded article. Thereafter, the top and bottom of the molded article were each ground by a thickness of 0.5 mm to obtain a polishing layer having a thickness of 2 mm.

In addition, a cushion layer in which a polyester fiber nonwoven fabric was impregnated with a polyurethane resin, in particular, a cushion layer having a hardness, a thickness, an initial load resistivity, and a compressive elastic modulus as shown in Table 1 below was selected, and the polishing layer and the cushion layer were laminated using a hot melt adhesive to prepare a polishing pad.

Example 2

A polishing pad was prepared in the same manner as in Example 1, except that a cushion layer having a hardness, a thickness, an initial load resistivity, and a compressive elastic modulus as shown in Table 1 was selected and used.

Example 3

3-1: Configuration of the Device

In the casting machine of Example 1, the feeding lines for the inert gas was cut off. PUGL-600D (manufactured by SKC with a weight average molecular weight of 1,500 g/mole) having an NCO content of 9.1% was charged to the prepolymer tank, and 4,4'-methylenebis(2-chloroaniline) (manufactured by TCI (Tokyo Chemical Industry)) was charged to the curing agent tank. Further, 2 parts by weight of a solid phase foaming agent (AkzoNobel) was mixed in advance based on 100 parts by weight of the urethane-based prepolymer, which was charged to the prepolymer tank.

3-2: Preparation of a Polishing Pad

The raw materials were stirred while they were fed to the mixing head at constant rates through the respective feeding lines. In such event, the prepolymer and the curing agent were fed at an equivalent ratio of 1:1. The mixed raw materials were injected into a mold (1,000 mm×1,000 mm×3 mm) preheated to 120° C. at a charge rate of 10 kg/min and cast at 120° C. to obtain a molded article. Thereafter, the top and bottom of the molded article were each ground by a thickness of 0.5 mm to obtain a polishing layer having a thickness of 2 mm.

In addition, a cushion layer in which a polyester fiber nonwoven fabric was impregnated with a polyurethane resin, in particular, a cushion layer having a hardness, a thickness, an initial load resistivity, and a compressive elastic modulus as shown in Table 1 below was selected, and the polishing layer and the cushion layer were laminated using a hot melt adhesive to prepare a polishing pad.

Example 4

A polishing pad was prepared in the same manner as in Example 3, except that a cushion layer having a hardness, a thickness, an initial load resistivity, and a compressive elastic modulus as shown in Table 1 was selected and used.

Comparative Example 1

A polishing pad was prepared in the same manner as in Example 1, except that a cushion layer having a hardness, a thickness, an initial load resistivity, and a compressive elastic modulus as shown in Table 1 was selected and used.

Comparative Example 2

A polishing pad was prepared in the same manner as in Example 3, except that a cushion layer having a hardness, a thickness, an initial load resistivity, and a compressive elastic modulus as shown in Table 1 was selected and used.

Example 5

A polishing layer was prepared in the same manner as in Example 1.

Next, a cushion layer in which a polyester fiber nonwoven fabric was impregnated with a polyurethane resin, in particular, a cushion layer having a hardness as shown in Table 2 below was selected, and the polishing layer and the cushion layer were laminated using a hot melt adhesive to prepare a polishing pad comprising a laminate having the thickness, initial load resistivity, and compressive elasticity shown in Table 2 below.

Example 6

A polishing pad was prepared in the same manner as in Example 5, except that the mixed raw materials were injected into a mold (1,000 mm×1,000 mm×3 mm) preheated to 80° C. at a charge rate of 10 kg/min and cast at 120° C. to obtain a molded article and that a cushion layer having a hardness as shown in Table 2 below was selected, and the polishing layer and the cushion layer were laminated using a hot melt adhesive to prepare a polishing pad comprising a laminate having the thickness, initial load resistivity, and compressive elasticity shown in Table 2 below.

Example 7

A polishing pad was prepared in the same manner as in Example 5, except that a cushion layer having a hardness as shown in Table 2 below was selected, and the polishing layer and the cushion layer were laminated using a hot melt adhesive to prepare a polishing pad comprising a laminate having the thickness, initial load resistivity, and compressive elasticity shown in Table 2 below.

Example 8

A polishing layer was prepared in the same manner as in Example 4.

Next, a cushion layer in which a polyester fiber nonwoven fabric was impregnated with a polyurethane resin, in particular, a cushion layer having a hardness as shown in Table 2 below was selected, and the polishing layer and the cushion layer were laminated using a hot melt adhesive to prepare a polishing pad comprising a laminate having the thickness, initial load resistivity, and compressive elasticity shown in Table 2 below.

Example 9

A polishing pad was prepared in the same manner as in Example 8, except that the mixed raw materials were injected into a mold (1,000 mm×1,000 mm×3 mm) preheated to 80° C. at a charge rate of 10 kg/min and cast at 120° C. to obtain a molded article and that a cushion layer having a hardness as shown in Table 2 below was selected, and the polishing layer and the cushion layer were laminated using a hot melt adhesive to prepare a polishing pad comprising a laminate having the thickness, initial load resistivity, and compressive elasticity shown in Table 2 below.

Example 10

A polishing pad was prepared in the same manner as in Example 8, except that a cushion layer having a hardness as shown in Table 2 below was selected, and the polishing layer and the cushion layer were laminated using a hot melt adhesive to prepare a polishing pad comprising a laminate having the thickness, initial load resistivity, and compressive elasticity shown in Table 2 below.

Comparative Example 3

A polishing pad was prepared in the same manner as in Example 5, except that a cushion layer having a hardness as shown in Table 2 below was selected, and the polishing layer and the cushion layer were laminated using a hot melt adhesive to prepare a polishing pad comprising a laminate having the thickness, initial load resistivity, and compressive elasticity shown in Table 2 below.

Comparative Example 4

A polishing pad was prepared in the same manner as in Example 8, except that a cushion layer having a hardness as shown in Table 2 below was selected, and the polishing layer and the cushion layer were laminated using a hot melt adhesive to prepare a polishing pad comprising a laminate having the thickness, initial load resistivity, and compressive elasticity shown in Table 2 below.

Evaluation Example

The polishing pads prepared in Examples 1 to 10 and Comparative Examples 1 to 4 were measured and evaluated for the following physical properties. The results are shown in Tables 1 and 2 below.

Evaluation Example 1: Hardness

Samples of the cushion layers were each cut to 5 cm×5 cm (thickness: as shown in Tables 1 and 2) and stored at a temperature of 25° C. for 12 hours to measure the Asker C hardness using a hardness tester.

Evaluation Example 2: Initial Load Resistivity (%)

Samples of the cushion layers and laminates were each cut to 5 cm×5 cm (thickness: as shown in Tables 1 and 2). The thickness of the cushion layer and the thickness of the laminate were measured in the no-load state, and they are referred to as $T1_C$ (mm) and $T1_L$ (mm), respectively. The thickness of the cushion layer and the thickness of the laminate were measured when a stress load of 30 kPa was maintained for 60 seconds from the no-load state, and they are referred to as $T2_C$ (mm) and $T2_L$ (mm), respectively. The thickness of the cushion layer and the thickness of the laminate were measured when a stress load of 50 kPa was maintained for 60 seconds from the respective states of $T2_C$ and $T2_L$, and they are referred to as $T3_C$ (mm) and $T3_L$ (mm), respectively. Then, the initial load resistivities ($LR_C$, $LR_L$) were calculated according to the following Equations 1 and 5.

$$LR_L(\%) = \frac{T1L - T2L}{T1L - T3L} \times 100 \quad \text{[Equation 1]}$$

$$LR_C(\%) = \frac{T1c - T2c}{T1c - T3c} \times 100 \quad \text{[Equation 5]}$$

Evaluation Example 3: Compressive Elasticity (%)

Samples of the cushion layers and laminates were each cut to 5 cm×5 cm (thickness: as shown in Tables 1 and 2). The thickness of the cushion layer and the thickness of the laminate were measured when a stress load of 30 kPa was maintained for 60 seconds from the no-load state, and they are referred to as $T2_C$ (mm) and $T2_L$ (mm), respectively. The thickness of the cushion layer and the thickness of the laminate were measured when a stress load of 50 kPa was maintained for 60 seconds from the respective states of $T2_C$ and $T2_L$, and they are referred to as $T3_C$ (mm) and $T3_L$ (mm), respectively. The thickness of the cushion layer and the thickness of the laminate were measured when the cushion layer and the laminate were left for 60 seconds after the stress load had been released from the respective states of $T3_C$ and $T3_L$, and a stress load of 30 kPa (300 g/cm$^2$) was then maintained for 60 seconds, and they are referred to as $T4_C$ (mm) and $T4_L$ (mm), respectively. Then, the compressive elasticities ($CE_C$, $CE_L$) were calculated according to the following Equations 2 and 6.

$$CE_L(\%) = \frac{T4L - T3L}{T2L - T3L} \times 100 \quad \text{[Equation 2]}$$

$$CEc(\%) = \frac{T4c - T3c}{T2c - T3c} \times 100 \quad \text{[Equation 6]}$$

Evaluation Example 4: Elastic Modulus

Samples of the polishing pads were each cut to 4 cm×1 cm (thickness: as shown in Tables 1 and 2). The modulus was measured as the slope between the elongation at 70% and the elongation at 20% while the sample was tested at a speed of 50 mm/min using a universal testing machine (UTM).

Evaluation Example 5: Polishing Rate

The polishing rate was evaluated in the following manner for Examples 1 to 4 and Comparative Examples 1 and 2.

A silicon wafer having a diameter of 300 mm with a silicon oxide ($SiO_x$) layer formed by a TEOS-plasma CVD process was set in a CMP polishing machine. Thereafter, the silicon wafer was set on the platen to which the polishing pad was attached, while the silicon oxide layer of the silicon wafer faced downward. Thereafter, the silicon oxide layer was polished under a polishing load of 1.4 psi while the platen was rotated at a speed of 115 rpm for 60 seconds and a calcined silica slurry was supplied onto the polishing pad at a rate of 190 ml/min. Upon completion of the polishing, the silicon wafer was detached from the carrier, mounted in a spin dryer, washed with deionized water (DIW), and then dried with air for 15 seconds. The difference in film thickness of the dried silicon wafer before and after the polishing was measured using a spectral reflectometer type thickness measuring instrument (manufacturer: Kyence, model: SI-F80R). The polishing rate was calculated using the following Equation.

Polishing rate(Å/min)=polished thickness of a silicon wafer(Å)/polishing time (minute)

Evaluation Example 6: Polishing Rate

The polishing rate was evaluated in the following manner for Examples 5 to 10 and Comparative Examples 3 and 4.

A silicon wafer having a diameter of 300 mm with a tungsten (W) layer formed by a CVD process was set in a CMP polishing machine. Thereafter, the silicon wafer was set on the platen to which the polishing pad was attached, while the tungsten (W) layer of the silicon wafer faced downward. Thereafter, the tungsten (W) layer was polished under a polishing load of 2.8 psi while the platen was rotated at a speed of 115 rpm for 30 seconds and a calcined silica slurry was supplied onto the polishing pad at a rate of 190 ml/min. Upon completion of the polishing, the silicon wafer was detached from the carrier, mounted in a spin dryer, washed with deionized water (DIW), and then dried with air for 15 seconds. The difference in film thickness of the dried silicon wafer before and after the polishing was measured using a contact type sheet resistance measuring instrument (with a 4-point probe). The polishing rate was calculated using the Equation of Evaluation Example 5.

Evaluation Example 7: Within-Wafer Non-Uniformity

The silicon wafers having a silicon oxide ($SiO_x$) layer prepared in the same manner as in Evaluation Example 5 on which a thermal oxide layer of 1 μm (10,000 Å) had been formed was polished for 1 minute under the polishing conditions as described above. The in-plane film thickness at 98 points of the wafer was measured to calculate the within-wafer non-uniformity (WIWNU) by the following Equation.

In addition, for the silicon wafers on which a tungsten (W) layer was formed, which was prepared in the same manner as in Evaluation Example 6, the polishing within-wafer non-uniformity was measured by the same method.

Within-wafer non-uniformity (WIWNU) (%)=(standard deviation of polished thickness (Å)/average polished thickness (Å))×100(%)

TABLE 1

| | Cushion layer | | | | Polishing rate $SiO_x$ (Å/mm) | Within-wafer non-uniformity $SiO_x$ (%) |
|---|---|---|---|---|---|---|
| | Thickness (mm) | Hardness (Asker C) | Initial load resistivity (%) | Compressive elasticity (%) | Elastic modulus (kgf/cm²) | | |
| Ex. 1 | 1.339 | 71.550 | 81.60 | 73.91 | 119.3 | 2,486 | 4.8 |
| Ex. 2 | 1.339 | 70.954 | 78.95 | 54.17 | 105.6 | 2,348 | 4.9 |
| Ex. 3 | 1.339 | 70.049 | 87.10 | 87.50 | 130.0 | 2,273 | 3.0 |
| Ex. 4 | 1.502 | 69.445 | 45.63 | 89.74 | 165.3 | 2,645 | 5.2 |
| C. Ex. 1 | 1.540 | 68.945 | 42.56 | 93.32 | 172.5 | 2,751 | 5.8 |
| C. Ex. 2 | 1.463 | 68.514 | 38.95 | 94.83 | 194.6 | 2,864 | 5.6 |

TABLE 2

| | Cushion layer Hardness (Asker C) | Laminate | | | | Polishing rate W (Å/mm) | Within-wafer non-uniformity W (%) |
|---|---|---|---|---|---|---|---|
| | | Thickness (mm) | Initial load resistivity (%) | Compressive elasticity (%) | Elastic modulus (kgf/cm²) | | |
| Ex. 5 | 71.55 | 3.413 | 94.96 | 83.33 | 119.3 | 3,724 | 3.2 |
| Ex. 6 | 71.2 | 3.411 | 91.80 | 90.00 | 130 | 3,324 | 3.8 |
| Ex. 7 | 71.75 | 3.412 | 94.74 | 77.78 | 105 | 3,806 | 3.1 |
| Ex. 8 | 71.11 | 3.411 | 91.13 | 90.91 | 125.2 | 3,357 | 3.4 |

TABLE 2-continued

| | Cushion layer Hardness (mm) | Laminate Thickness (Asker C) | Initial load resistivity (%) | Compressive elasticity (%) | Elastic modulus (kgf/cm$^2$) | Polishing rate W (Å/mm) | Within-wafer non-uniformity W (%) |
|---|---|---|---|---|---|---|---|
| Ex. 9 | 71.32 | 3.407 | 94.64 | 88.89 | 120.3 | 3,345 | 3.9 |
| Ex. 10 | 73.9 | 3.405 | 95.76 | 71.43 | 110.5 | 3,797 | 3.5 |
| C. Ex. 3 | 74.5 | 3.416 | 87.83 | 28.57 | 95.2 | 3,842 | 4.5 |
| C. Ex. 4 | 74.2 | 3.419 | 38.46 | 46.88 | 80.4 | 3,905 | 4.7 |

As shown in Tables 1 and 2 above, the polishing pads of Examples 1 to 10 were excellent in polishing rate and within-wafer non-uniformity as compared with the polishing pads of Comparative Examples 1 to 4.

REFERENCE NUMERAL OF THE DRAWINGS

| 110: polishing pad | 120: platen |
|---|---|
| 130: semiconductor substrate | 140: nozzle |
| 150: polishing slurry | 160: polishing head |
| 170: conditioner | |

The invention claimed is:

1. A polishing pad, which comprises a laminate composed of a polishing layer, an adhesive layer, and a cushion layer,
   wherein a hardness of the cushion layer is 68 to 74 Asker C,
   wherein the polishing layer comprises a cured product of a composition comprising a urethane-based prepolymer, a curing agent, and a foaming agent, and satisfying at least one of the following (i), (ii), and (iii):
   (i) the urethane-based prepolymer comprises a reaction product of at least one isocyanate compound and at least one polyol,
   (ii) the curing agent is at least one selected from the group consisting of an amine compound and an alcohol compound, and
   (iii) the foaming agent is at least one selected from the group consisting of a solid phase foaming agent and a gas phase foaming agent, and
   wherein a initial load resistivity ($LR_L$) of the laminate defined by the following Equation 1 is 88% or more:

$$LR_L(\%) = \frac{T1L - T2L}{T1L - T3L} \times 100 \quad \text{[Equation 1]}$$

in Equation 1,
   the $T1_L$ is the thickness of the laminate in the no-load state,
   the $T2_L$ is the thickness of the laminate when a stress load of 30 kPa is maintained for 60 seconds from the no-load state, and
   the $T3_L$ is the thickness of the laminate when a stress load of 50 kPa is maintained for 60 seconds from the $T2_L$ state.

2. The polishing pad of claim 1, wherein the laminate has a compressive elasticity ($CE_L$), defined by the following Equation 2, of 50% or more:

$$CE_L(\%) = \frac{T4L - T3L}{T2L - T3L} \times 100 \quad \text{[Equation 2]}$$

in Equation 2,
   the $T4_L$ is the thickness of the laminate when the laminate is left for 60 seconds after the stress load has been released from the $T3_L$ state, and a stress load of 30 kPa is then maintained for 60 seconds.

3. The polishing pad of claim 1, wherein the thickness ($T1_L$) of the laminate in the no-load state is 2.0 to 4.5 mm.

4. The polishing pad of claim 1, wherein the polishing pad has an elastic modulus$_L$ of 100 to 160 kgf/cm$^2$.

5. The polishing pad of claim 1, wherein the polishing pad is capable of achieving a polishing rate of 3,840 Å/min or less for tungsten (W), and a within-wafer non-uniformity of 4.3% or less for tungsten (W),
   wherein the polishing rate and the within-wafer non-uniformity are determined according to the following equations and measured under the following measurement conditions:

polishing rate(Å/min)=polished thickness(Å) of tungsten layer formed on silicon wafer/polishing time(minute)

measurement conditions of polishing rate: the tungsten layer formed on silicon wafer is polished by the polishing pad under a polishing load of 2.8 psi and rotation speed of 115 rpm for 30 seconds, and the difference in thickness of the silicon wafer before and after the polishing is measured using a contact sheet resistance measuring instrument with a 4-point probe; and within-wafer non-uniformity(%)=(standard deviation of polished thickness(Å) of tungsten layer formed on silicon wafer/average polished thickness(Å) of tungsten layer formed on silicon wafer)×100(%)

measurement conditions of within-wafer non-uniformity: the tungsten layer formed on silicon wafer is polished by the polishing pad under a polishing load of 2.8 psi and rotation speed of 115 rpm for 1 minute, and in-film thickness at 98 points of the silicon wafer is measured.

6. The polishing pad of claim 1, wherein the cushion layer comprises a nonwoven fabric or a suede.

7. The polishing pad of claim 1, wherein the adhesive layer comprises a hot-melt adhesive.

8. A polishing pad, which comprises a polishing layer and a cushion layer,
   wherein the hardness of the cushion layer is 69 to 80 Asker C,
   wherein the polishing layer comprises a cured product of a composition comprising a urethane-based prepolymer, a curing agent, and a foaming agent, and satisfying at least one of the following (i), (ii), and (iii):

(i) the urethane-based prepolymer comprises a reaction product of at least one isocyanate compound and at least one polyol,
(ii) the curing agent is at least one selected from the group consisting of an amine compound and an alcohol compound, and
(iii) the foaming agent is at least one selected from the group consisting of a solid phase foaming agent and a gas phase foaming agent, and wherein a initial load resistivity ($LR_C$) of the cushion layer defined by the following Equation 5 is 45% or more:

$$LR_C(\%) = \frac{T1c - T2c}{T1c - T3c} \times 100 \qquad [\text{Equation 5}]$$

in Equation 5,
the $T1_C$ is the thickness of the cushion layer in the no-load state,
the $T2_C$ is the thickness of the cushion layer when a stress load of 30 kPa is maintained for 60 seconds from the no-load state, and
the $T3_C$ is the thickness of the cushion layer when a stress load of 50 kPa is maintained for 60 seconds from the $T2_C$ state.

9. The polishing pad of claim 8, wherein a compressive elasticity (CES) of the cushion layer is less than 90% defined by the following Equation 6:

$$CEc(\%) = \frac{T4c - T3c}{T2c - T3c} \times 100 \qquad [\text{Equation 6}]$$

in Equation 6,
the $T4_C$ is the thickness of the cushion layer when the cushion layer is left for 60 seconds after the stress load has been released from the $T3_C$ state, and a stress load of 30 kPa (300 g/cm$^2$) is then maintained for 60 seconds.

10. The polishing pad of claim 8, wherein the thickness (Tic) of the cushion layer in the no-load state is 0.5 to 2.5 mm.

11. The polishing pad of claim 8, wherein the polishing pad has an elastic modulus$_L$ of 80 to 170 kgf/cm$^2$.

12. The polishing pad of claim 8, wherein the polishing pad is capable of achieving a polishing rate of 2,700 Å/min or less for silicon oxide (SiO$_x$), and a within-wafer non-uniformity of 5.5% or less for silicon oxide (SiO$_x$),
wherein, the polishing rate and the within-wafer non-uniformity are determined according to the following equations and measured under the following measurement conditions:

polishing rate(Å/min)=polished thickness(Å) of silicon oxide(SiO$_x$) layer formed on silicon wafer/polishing time(minute)

measurement conditions of polishing rate: the silicon oxide (SiO$_x$) layer formed on silicon wafer is polished by the polishing pad under a polishing load of 1.4 psi and rotation speed of 115 rpm for 60 seconds, and the difference in thickness of the silicon wafer before and after the polishing is measured using a spectral reflectometer thickness measuring instrument; and within-wafer non-uniformity(%)=(standard deviation of polished thickness(Å) of silicon oxide(SiO$_x$) layer formed on silicon wafer/average polished thickness(Å) of silicon oxide(SiO$_x$) layer formed on silicon wafer)×100(%)

measurement conditions of within-wafer non-uniformity: the silicon oxide (SiO$_x$) layer formed on silicon wafer is polished by the polishing pad under a polishing load of 1.4 psi and rotation speed of 115 rpm for 60 seconds, and in-film thickness at 98 points of the silicon wafer is measured.

13. The polishing pad of claim 8, wherein the polishing pad further comprises an adhesive layer between the polishing layer and the cushion layer, wherein the adhesive layer comprises a hot-melt adhesive.

14. A process for preparing a semiconductor device, which comprises:
preparing a polishing pad comprising a laminate composed of a polishing layer, an adhesive layer, and a cushion layer; and
relatively rotating the surface of the polishing layer of the polishing pad and the surface of a wafer while they are in contact with each other to polish the surface of the wafer,
wherein a initial load resistivity ($LR_L$) of the laminate defined by Equation 1 is 88% or more:

$$LR_L(\%) = \frac{T1L - T2L}{T1L - T3L} \times 100 \qquad [\text{Equation 1}]$$

in Equation 1,
the $T1_L$ is the thickness of the laminate in the no-load state,
the $T2_L$ is the thickness of the laminate when a stress load of 30 kPa is maintained for 60 seconds from the no-load state, and
the $T3_L$ is the thickness of the laminate when a stress load of 50 kPa is maintained for 60 seconds from the $T2_L$ state;
wherein a hardness of the cushion layer is 68 to 74 Asker C; and
wherein the polishing layer comprises a cured product of a composition comprising a urethane-based prepolymer, a curing agent, and a foaming agent, and satisfying at least one of the following (i), (ii), and (iii):
(i) the urethane-based prepolymer comprises a reaction product of at least one isocyanate compound and at least one polyol,
(ii) the curing agent is at least one selected from the group consisting of an amine compound and an alcohol compound, and
(iii) the foaming agent is at least one selected from the group consisting of a solid phase foaming agent and a gas phase foaming agent.

* * * * *